(12) United States Patent
Shi et al.

(10) Patent No.: US 9,837,371 B2
(45) Date of Patent: Dec. 5, 2017

(54) STRUCTURE AND METHOD OF REINFORCING A CONDUCTOR SOLDERING POINT OF SEMICONDUCTOR DEVICE

(71) Applicant: TONGFU MICROELECTRONICS CO., LTD., Nantong, Jiangsu (CN)

(72) Inventors: Haizhong Shi, Jiangsu (CN); Honghui Wang, Jiangsu (CN); Jing Wu, Jiangsu (CN)

(73) Assignee: TONGFU MICROELECTRONICS CO., L,TD., Nantong (CN)

( * ) Notice: Subject to any disclaimer, the term of this patent is extended or adjusted under 35 U.S.C. 154(b) by 0 days.

(21) Appl. No.: 15/106,774

(22) PCT Filed: Nov. 7, 2014

(86) PCT No.: PCT/CN2014/090580
§ 371 (c)(1),
(2) Date: Jun. 20, 2016

(87) PCT Pub. No.: WO2016/000377
PCT Pub. Date: Jan. 7, 2016

(65) Prior Publication Data
US 2017/0207189 A1    Jul. 20, 2017

(30) Foreign Application Priority Data

Jun. 30, 2014  (CN) .......................... 2014 1 0308072
Jun. 30, 2014  (CN) .......................... 2014 1 0308073

(51) Int. Cl.
*H01L 23/00*        (2006.01)
*H01L 23/495*       (2006.01)

(52) U.S. Cl.
CPC .......... *H01L 24/48* (2013.01); *H01L 23/4952* (2013.01); *H01L 24/03* (2013.01);
(Continued)

(58) Field of Classification Search
CPC ..... H01L 24/48; H01L 24/4952; H01L 24/03; H01L 24/05; H01L 24/42; H01L 24/49; H01L 24/85
See application file for complete search history.

(56) References Cited

U.S. PATENT DOCUMENTS

| 7,732,937 B2 | 6/2010 | Goller et al. |
| 2008/0067649 A1* | 3/2008 | Matsunaga ......... H01L 21/4832 257/677 |
| 2009/0224382 A1* | 9/2009 | Goller ................... H01L 21/565 257/676 |

FOREIGN PATENT DOCUMENTS

| CN | 101517738 A | 8/2009 |
| CN | 103579063 A | 2/2014 |

(Continued)

OTHER PUBLICATIONS

Nantong Fujitsu Microelectronics Co., Ltd., International Search Report, PCT/CN2014/090580, Mar. 17, 2015, 2 pgs.

*Primary Examiner* — Whitney T Moore
*Assistant Examiner* — Joseph Galvin, III
(74) *Attorney, Agent, or Firm* — Anova Law Group, PLLC

(57) ABSTRACT

The present invention provides a structure and a method of reinforcing a conductor soldering point of a semiconductor device. The structure includes an inner frame lead, a soldering area arranged on the surface of the inner frame lead, a conductor soldered in the soldering area, and a locking card including a pressing part, a locking part overhangs outwards from the pressing part pressed on the conductor. The locking part penetrates through the inner frame lead and is clamped on the side of the inner frame lead deviating from the conductor. According to the present invention, the conductor soldered on the inner frame lead is firmly clamped on the inner frame lead through the locking card to effectively (Continued)

avoid the stripping condition of the conductor and the inner frame lead, reinforce the electrical connection of the conductor and the inner frame lead, and improve the reliability of the semiconductor device.

18 Claims, 3 Drawing Sheets

(52) U.S. Cl.
CPC .............. *H01L 24/05* (2013.01); *H01L 24/43* (2013.01); *H01L 24/49* (2013.01); *H01L 24/85* (2013.01); *H01L 2224/04042* (2013.01); *H01L 2224/32245* (2013.01); *H01L 2224/48247* (2013.01); *H01L 2224/48624* (2013.01); *H01L 2224/4903* (2013.01); *H01L 2224/49111* (2013.01); *H01L 2224/85051* (2013.01)

(56) References Cited

FOREIGN PATENT DOCUMENTS

| | | |
|---|---|---|
| CN | 104064485 A | 9/2014 |
| CN | 104064540 A | 9/2014 |

\* cited by examiner

STRUCTURE AND METHOD OF REINFORCING A CONDUCTOR SOLDERING POINT OF SEMICONDUCTOR DEVICE

CROSS REFERENCE TO RELATED APPLICATIONS

This Application is a United States National Stage Application filed under 35 U.S.C. §371 of PCT patent application Ser. No. PCT/CN2014/090580 filed on Nov. 7, 2014, which claims the benefit of and priority to Chinese Patent Application No. 201410308072.2 filed on Jun. 30, 2014, and Chinese Patent Application No. 201410308073.7 filed on Jun. 30, 2014, which are hereby incorporated by reference in their entirety.

FIELD OF THE INVENTION

The present invention relates to the technical field of semiconductor device package, and particularly relates to a structure and method of reinforcing a conductor soldering point of a semiconductor device.

BACKGROUND OF THE INVENTION

In a package process of a semiconductor power device, a chip and an inner frame lead of a lead frame are effectively soldered by mainly using such metal wires as an aluminum wire, an aluminum band and the like, in order to meet such high electrical performance requirements as high voltage, high current and the like, when the power device is at work. As shown in FIG. 1 to FIG. 4, a package structure includes: a frame chip bearing platform 1 used for radiating and bearing a chip 2; an inner frame lead 3 for electrical connection; an aluminum wire 4 and/or an aluminum band 5 used for connecting the chip 2 with the inner frame lead 3; and chip mounting adhesive 6 used for adhering the chip 2 on the frame chip bearing platform 1.

When a power product is at work, the internal temperature of the device is quite high and the external working environment is quite harsh sometimes, thereby requiring that the soldering reliability of the aluminum wire 4 and/or the aluminum band 5 and the inner frame lead 3 is quite high, but in the reliability of the power product, the aluminum wire 4 and the aluminum band 5 are stripped off from the inner frame lead 3 due to heat stress, moisture, process quality control fluctuation and the like in practical application, resulting in failure of electrical parameters and functions of the product. For this failure, although the soldering reliability is perfected in the industry from such aspects as bonding parameters, steel nozzle structures, materials, process hierarchical control or the like, the stripping of the aluminum wire 4 and the aluminum band 5 with the inner frame lead 3 cannot be very effectively avoided.

SUMMARY OF THE INVENTION

A brief overview of the present invention will be given below, in order to provide a basic understanding about certain aspects of the present invention. It should be understood that this overview is not an exhaustive overview of the present invention. It is not intended to determine the critical or important part of the present invention and to limit the scope of the present invention. The purpose is merely to present some concepts in a simplified form to serve as the preamble of a more detailed description which will be discussed later.

The present invention provides a reinforcing structure of a conductor soldering point of a semiconductor device, including an inner frame lead, a soldering area being arranged on the surface of the inner frame lead, and a conductor being soldered in the soldering area, and the reinforcing structure of a conductor soldering point further includes:

a locking card, wherein the locking card includes a pressing part, a locking part overhangs outwards from the pressing part, the pressing part is pressed on the conductor, and the locking part penetrates through the inner frame lead and is clamped on the side of the inner frame lead deviating from the conductor.

The present invention also provides a reinforcing method of a conductor soldering point of a semiconductor device, including:

forming at least two through holes in a soldering area of an inner frame lead;

soldering a conductor in the soldering area, wherein the soldering position of the conductor is located between two adjacent through holes; and setting locking cards in the through holes for tightly clamping the conductor with the inner frame lead.

According to the above solution provided by the present invention, the conductor soldered on the inner frame lead is firmly clamped on the inner frame lead through the locking card, in order to effectively avoid the stripping condition of the conductor and the inner frame lead, reinforce the electrical connection of the conductor and the inner frame lead, and improve the reliability of the semiconductor device, particularly a semiconductor power device.

BRIEF DESCRIPTION OF THE DRAWINGS

With reference to the following description of the embodiments of the present invention in combination with accompanying drawings, the above and other objects, features and advantages of the present invention will be understood more easily. Components in the accompanying drawings are merely used for illustrating the principles of the present invention. In the accompanying drawings, identical or similar technical features or components are represented by identical or similar reference numerals.

DETAILED DESCRIPTION OF THE EMBODIMENTS

Embodiments of the present invention will be described below with reference to the accompanying drawings. Elements and features described in one accompanying drawing or one embodiment of the present invention can be combined with elements and features shown in one or more other accompanying drawings or embodiments. It should be noted that, for the purpose of clarity, expressions and descriptions of components and processing irrespective to the present invention and known to those of ordinary skill in the art are omitted in the accompanying drawings and the illustration.

Figure 1:
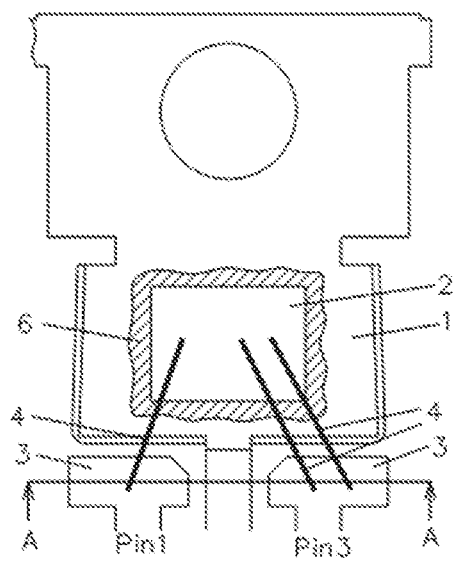
FIG. 1 is a schematic diagram of a structure of a prior art.
Figure 2:
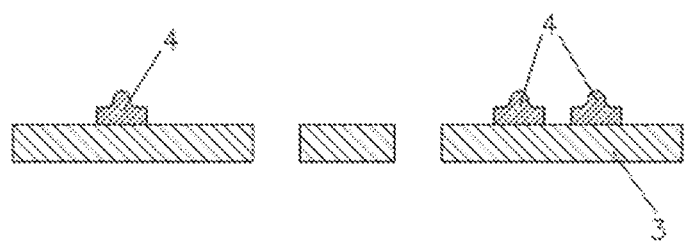
FIG. 2 is an A-A sectional view of FIG. 1.
Figure 3:
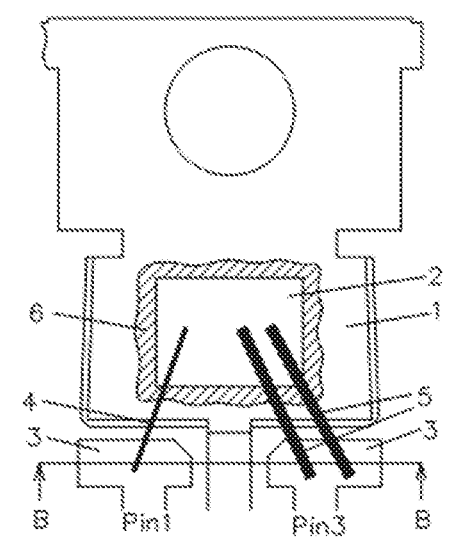
FIG. 3 is a schematic diagram of a structure of another prior art.
Figure 4:
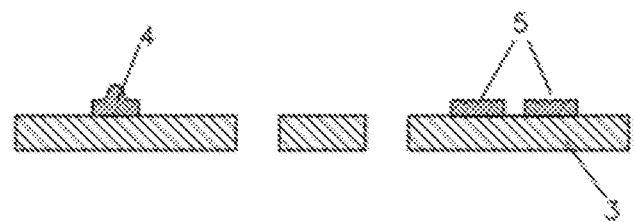
FIG. 4 is a B-B sectional view of FIG. 3.
Figure 5:
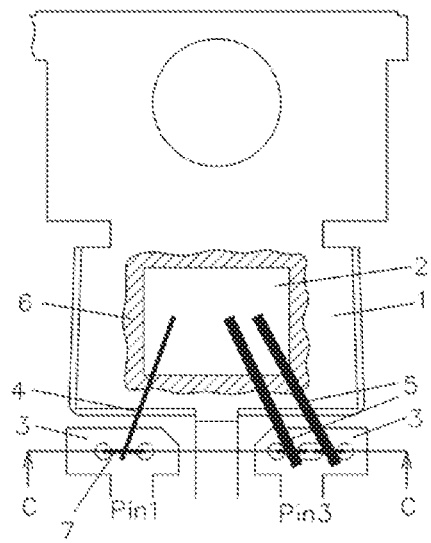
FIG. 5 is a schematic diagram of a reinforcing structure of a conductor soldering point of a semiconductor device provided by an embodiment of the present invention.
Figure 6:
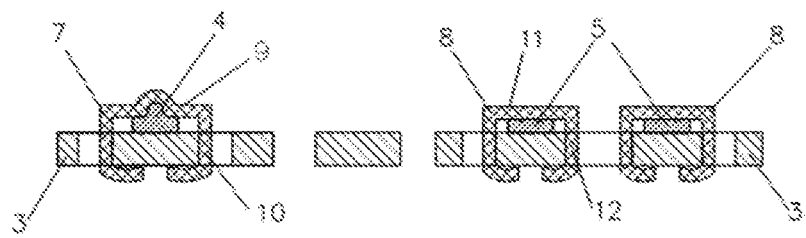
FIG. 6 is a C-C sectional view of FIG. 5.

FIG. 5 is a schematic diagram of a reinforcing structure of a conductor soldering point of a semiconductor device provided by an embodiment of the present invention; FIG. 6 is a C-C sectional view of FIG. 5. As shown in FIG. 5 and FIG. 6, the reinforcing structure of a conductor soldering point of the semiconductor device provided by the embodiment of the present invention includes an inner frame lead 3, wherein a soldering area is arranged on the surface of the inner frame lead 3, a conductor is soldered in the soldering area, the reinforcing structure of a conductor soldering point further includes a locking card; the locking card includes a pressing part, a locking part overhangs outwards from the pressing part, the pressing part is pressed on the conductor, and the locking part penetrates through the inner frame lead 3 and is clamped on the side of the inner frame lead 3 deviating from the conductor.

The embodiment of the present invention further provides a reinforcing method of a conductor soldering point of a semiconductor device, including:

forming at least two through holes in a soldering area of an inner frame lead;

soldering a conductor in the soldering area, wherein the soldering position of the conductor is located between two adjacent through holes; and setting locking cards in the through holes for tightly clamping the conductor with the inner frame lead.

The number of the through holes is determined by the number of the conductors to be soldered, and it is ensured that at least one through hole is formed in both sides of each conductor. For example, four through holes can be used for reinforcing two conductors, and independent through holes are formed in both sides of each conductor. Of course, three through holes can also be used for reinforcing two conductors, namely, a through hole at the middle can be shared, and under the condition of sharing the through hole, the shared through hole can be a hole or a strip-shaped hole with a larger size.

According to the above solution provided by the present invention, the conductor soldered on the inner frame lead 3 is firmly clamped on the inner frame lead 3 through the locking cards, in order to effectively avoid the stripping condition of the conductor and the inner frame lead, reinforce the electrical connection of the conductor and the inner frame lead, and improve the reliability of the semiconductor device, particularly a semiconductor power device.

It should be noted that, when the soldering area is close to the edge of the inner frame lead, at least one through hole is formed on the edge, and then this through hole can be considered as a groove penetrating through the inner frame lead. For example, the shape of the groove can be, but not limited to, a semicircle.

As shown in FIG. 5 and FIG. 6, a reinforcing structure of a conductor soldering point of a semiconductor device obtained by the method provided by the embodiment of the present invention includes an inner frame lead 3, wherein a soldering area is arranged on the surface of the inner frame lead 3, a conductor is soldered in the soldering area, the reinforcing structure of a conductor soldering point further includes a locking card; through holes penetrating through the inner frame lead are formed in both sides of the conductor; the locking card includes a pressing part, a locking part overhangs outwards from the pressing part, the pressing part is pressed on the conductor, and the locking part penetrates through the through holes and is clamped on the side of the inner frame lead deviating from the conductor.

Specifically, the locking part is provided with an overhanging tail end away from the pressing part, and the overhanging tail end is bent and buckled on the side of the inner frame lead 3 away from the conductor, wherein the locking part can be a metal strip or a sheet metal overhanging outwards from the pressing part. The end of the metal strip or the sheet metal away from the pressing part is the overhanging tail end. After the metal strip or the sheet metal penetrates through the through holes, the overhanging tail end thereof is bent to firmly press the metal strip or the sheet metal on one side of the inner frame lead 3. Due to this structure, the connecting reliability is high, the connection process is easy to achieve and the cost is low.

In practical use, through holes penetrating through the inner frame lead 3 are formed in both sides of the conductor, and the locking part penetrates through the inner frame lead via the through holes. Since the through holes are formed in both sides of the conductor, the locking part of the locking card penetrates through the through holes and is clamped on the side face of the inner frame lead 3, in order to well clamp the conductor on the inner frame lead tightly. In addition, a groove can also be formed on the edge of the inner frame lead, and the locking part penetrates through the inner frame lead through the groove. For example, the groove can be, but not limited to, a semicircular through hole.

In practical use, two locking parts overhang outwards on the pressing part in the same direction, and the overhanging tail ends of the two locking parts are bent face to face. The space on the side face of the inner frame lead occupied by face to face bending is small, so that the space on the side face of the inner frame lead can be utilized as much as possible. As a preferable embodiment, the locking card can adopt a straight flange C-shaped structure with approximately straight edges. In addition, as a possible solution, the overhanging tail ends of the two locking parts can also be bent back to back.

In practical use, the conductor can be an aluminum wire 4, an aluminum band 5 or a combination of the aluminum wire 4 and the aluminum band 5.

When the conductor is the aluminum wire 4, an arc-shaped projection is arranged on the side of the aluminum wire 4 deviating from the inner frame lead 3, the pressing part is provided with an arc-shaped arch, and the arc-shaped projection is coincident and matched with the arc-shaped arch, for ensuring a tighter contact of a locking card 7 and the conductor and improving the connecting stability of the locking card 7 and the aluminum wire 4. Taking it as an example that the locking card 7 adopts the straight flange C-shaped structure, an approximately straight part directly facing to the opening of the locking card 7 is a pressing part 9, the arc-shaped arch is arranged at the middle of the approximately straight part, locking parts 10 respectively extend downwards from both sides of the pressing part 9, and the overhanging tail ends of the locking parts 10 are bent and clamped on the lower side face of the inner frame lead 3.

Figure 7:
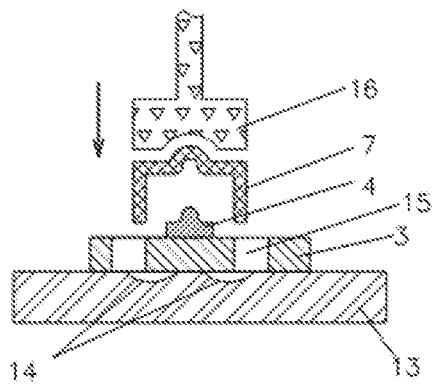
FIG. 7 is a schematic diagram for mounting a locking card on an inner frame lead in an embodiment of the present invention.
Figure 8:
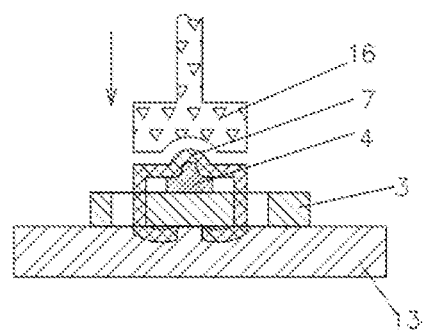
FIG. 8 is a schematic diagram of a locking card mounted to an inner frame lead in an embodiment of the present invention.

In a process of clamping the aluminum wire 4 with the inner frame lead through the locking card 7, see FIG. 7 and FIG. 8, a cushion block 13 is arranged below the inner frame lead 3, arc-shaped grooves 14 communicated with through holes 15 are formed in the upper surface of the cushion block 13, the arc-shaped grooves 14 deviate from the lower side of one of two adjacent through holes towards the other through hole, the locking card 7 is propelled downwards by a propelling mechanism 16, and when the overhanging tail ends of the locking parts contact the arc-shaped grooves 14, the propelling mechanism continues to move downwards to promote the overhanging tail end of the locking card 7 to be bent and clamped on the side face of the inner frame lead 3 along the arc-shaped groove 14, in order to firmly clamp the aluminum wire 4 with the inner frame lead 3.

In addition, the overhanging tail ends of the two locking parts can also be bent back to back. When the method is implemented by adopting this structure, the cushion block is arranged below the inner frame lead, the arc-shaped grooves communicated with through holes are formed in the upper surface of the cushion block, the arc-shaped grooves deviate from the lower side of one of two adjacent through holes towards the other through hole, the locking card is propelled downwards by the propelling mechanism, and when the overhanging tail ends of the locking parts contact the arc-shaped grooves, the propelling mechanism continues to move downwards to promote the overhanging tail ends of the locking card 7 to be bent back to back and clamped on the side face of the inner frame lead along the arc-shaped grooves, in order to firmly clamp the aluminum wire with the inner frame lead together.

When the conductor is the aluminum band 5, the side facing to the aluminum band 5 of the pressing part 11 is a plane, and the plane is coincident and matched with the surface of the aluminum band 5, for ensuring a tighter contact of a locking card 8 and the conductor and improving the connecting stability of the locking card 8 and the aluminum band 5. Taking it as an example that the locking card 8 adopts the straight flange C-shaped structure, a straight part directly facing to the opening of the locking card 8 is the pressing part 11. Locking parts 12 respectively extend downwards from both sides of the pressing part 11, and the overhanging tail ends of the locking parts 12 are bent and clamped on the lower side face of the inner frame lead 3. The technical process of clamping the aluminum band 5 with the inner frame lead 3 together through the locking card is the same as the technical process of clamping the aluminum wire 4 with the inner frame lead 3 together through the locking card, and will not be repeated herein.

In practical use, the reinforcing structure of a conductor soldering point of the semiconductor device further includes a frame chip bearing platform 1, wherein a chip 2 is fixedly connected to the frame chip bearing platform 1, or the chip 2 can be adhered on the frame chip bearing platform 1 by chip mounting adhesive 6, and the end of the conductor away from the inner frame lead 3 is soldered with the chip 2.

In addition, it should be noted that, the method is implemented in such a way that the conductor and the inner frame lead are clamped through the locking card, the cushion block 13 and the propelling mechanism 16 can be arranged on an aluminum wire or aluminum band bonding machine, and the above method is directly implemented on the aluminum wire or aluminum band bonding machine after the aluminum wire or the aluminum band is bonded. Of course, the cushion block 13 and the propelling mechanism 16 can also be manufactured as single equipment, after the aluminum wire or the aluminum band is bonded, the frame is taken off from the aluminum wire or aluminum band bonding machine, and the above method is implemented on the equipment formed by the cushion block 13 and the propelling mechanism 16.

Finally, it should be noted that the above-mentioned embodiments are merely used for illustrating the technical solutions of the present invention, rather than limiting them. Although the present invention has been described in detail with reference to the foregoing embodiments, those of ordinary skill in the art should understand that they could still make modifications to the technical solutions recorded in the foregoing embodiments or make equivalent substitutions to a part of the technical features; and these modifications or substitutions do not make the essence of the corresponding technical solutions depart from the scope of the technical solutions of the embodiments of the present invention.

What is claimed:

1. A structure of reinforcing a conductor soldering point of a semiconductor device, comprising:
   an inner frame lead,
   a soldering area being arranged on the surface of the inner frame lead, and
   a conductor being soldered in the soldering area,
   wherein the structure of reinforcing a conductor soldering point further comprises a locking card and the locking card comprises a pressing part, a locking part overhangs outwards from the pressing part, the pressing part is pressed on the conductor, and the locking part penetrates through the inner frame lead and is clamped on the side of the inner frame lead deviating from the conductor.

2. The structure of reinforcing a conductor soldering point of the semiconductor device of claim 1, wherein the locking part is provided with an overhanging tail end away from the pressing part, and the overhanging tail end is bent and buckled on the side of the inner frame lead away from the conductor.

3. The structure of reinforcing a conductor soldering point of the semiconductor device of claim 2, wherein two locking parts overhang outwards on the pressing part in the same direction, and the overhanging tail ends of the two locking parts are bent face to face or bent back to back.

4. The structure of reinforcing a conductor soldering point of the semiconductor device of claim 1, wherein the conductor is an aluminum wire, an arc-shaped projection is arranged on the side of the aluminum wire deviating from the inner frame lead, the pressing part is provided with an arc-shaped arch, and the arc-shaped projection is coincident and matched with the arc-shaped arch.

5. The structure of reinforcing a conductor soldering point of the semiconductor device of claim 4, further comprising a frame chip bearing platform, wherein a chip is fixedly connected to the frame chip bearing platform, and the end of the conductor away from the inner frame lead is soldered with the chip.

6. The structure of reinforcing a conductor soldering point of the semiconductor device of claim 1, wherein the conductor is an aluminum band, the side of the pressing part facing to the aluminum band is a plane, and the plane is coincident and matched with the surface of the aluminum band.

7. The structure of reinforcing a conductor soldering point of the semiconductor device of claim 6, further comprising a frame chip bearing platform, wherein a chip is fixedly connected to the frame chip bearing platform, and the end of the conductor away from the inner frame lead is soldered with the chip.

8. The structure of reinforcing a conductor soldering point of the semiconductor device of claim 1, wherein through holes penetrating through the inner frame lead are formed on both sides of the conductor, and the locking part penetrates through the inner frame lead via the through holes.

9. The structure of reinforcing a conductor soldering point of the semiconductor device of claim 1, wherein a groove is formed on the edge of the inner frame lead, and the locking part penetrates through the inner frame lead through the groove.

10. A method of reinforcing a conductor soldering point of a semiconductor device, comprising:
forming at least two through holes in a soldering area of an inner frame lead;
soldering a conductor in the soldering area, wherein the soldering position of the conductor is located between two adjacent through holes; and
setting locking cards in the through holes for tightly clamping the conductor with the inner frame lead, wherein each locking card comprises a pressing part, a locking part overhangs outwards from the pressing part, the pressing part is pressed on the conductor, and the locking part penetrates through the through holes and is clamped on the side of the inner frame lead deviating from the conductor.

11. The method of reinforcing a conductor soldering point of the semiconductor device of claim 10, wherein the locking part is provided with an overhanging tail end away from the pressing part, and the overhanging tail end is bent and buckled on the side of the inner frame lead away from the conductor.

12. The method of reinforcing a conductor soldering point of the semiconductor device of claim 11, wherein two locking parts overhang outwards on the pressing part in the same direction, and the overhanging tail ends of the two locking parts are bent face to face.

13. The method of reinforcing a conductor soldering point of the semiconductor device of claim 12, wherein a cushion block is arranged below the inner frame lead, an arc-shaped groove communicated with through holes is formed in the upper surface of the cushion block, the arc-shaped groove deviates from the lower side of one of two adjacent through holes towards the other through hole, the locking cards are propelled downwards to bend the overhanging tail ends of the locking cards along the arc-shaped groove and clamp the same on the side face of the inner frame lead.

14. The method of reinforcing a conductor soldering point of the semiconductor device of claim 11, wherein two locking parts overhang outwards on the pressing part in the same direction, and the overhanging tail ends of the two locking parts are bent back to back.

15. The method of reinforcing a conductor soldering point of the semiconductor device of claim 14, wherein a cushion block is arranged below the inner frame lead, an arc-shaped groove communicated with through holes is formed in the upper surface of the cushion block, the arc-shaped groove deviates from the lower side of one of two adjacent through holes towards the other through hole, the locking card is propelled downwards to bend the overhanging tail ends of the locking card back to back along the arc-shaped groove and clamp the same on the side face of the inner frame lead.

16. The method of reinforcing a conductor soldering point of the semiconductor device of claim 10, wherein the conductor is an aluminum wire, an arc-shaped projection is arranged on the side of the aluminum wire deviating from the inner frame lead, the pressing part is provided with an arc-shaped arch, and the arc-shaped projection is coincident and matched with the arc-shaped arch.

17. The method of reinforcing a conductor soldering point of the semiconductor device of claim 10, wherein the conductor is an aluminum band, the side of the pressing part facing to the aluminum band is a plane, and the plane is coincident and matched with the surface of the aluminum band.

18. The method of reinforcing a conductor soldering point of the semiconductor device of claim 10, wherein a groove is formed on the edge of the inner frame lead, and the locking part penetrates through the inner frame lead through the groove.

\* \* \* \* \*